United States Patent
Kyhl et al.

(10) Patent No.: US 9,554,488 B2
(45) Date of Patent: Jan. 24, 2017

(54) METHOD TO ALIGN SURFACE MOUNT PACKAGES FOR THERMAL ENHANCEMENT

(71) Applicant: Raytheon Company, Waltham, MA (US)

(72) Inventors: Cary C. Kyhl, Waltham, MA (US); Scott M. Heston, Waltham, MA (US); James M. Elliott, Waltham, MA (US)

(73) Assignee: Raytheon Company, Waltham, MA (US)

( * ) Notice: Subject to any disclaimer, the term of this patent is extended or adjusted under 35 U.S.C. 154(b) by 225 days.

(21) Appl. No.: 14/256,108

(22) Filed: Apr. 18, 2014

(65) Prior Publication Data

US 2015/0305191 A1    Oct. 22, 2015

(51) Int. Cl.
*H05K 7/20* (2006.01)
*H05K 3/34* (2006.01)
(Continued)

(52) U.S. Cl.
CPC .......... *H05K 7/2039* (2013.01); *H05K 3/303* (2013.01); *H05K 3/321* (2013.01); *H05K 3/3426* (2013.01);
(Continued)

(58) Field of Classification Search
CPC .... H05K 7/2039; H05K 3/3426; H05K 3/303; H05K 3/321; H05K 2201/10689; H05K 2201/10628; H05K 2201/1056; H05K 3/305; Y02P 70/613
(Continued)

(56) References Cited

U.S. PATENT DOCUMENTS

| 5,053,357 A | * | 10/1991 | Lin | .......................... H01L 22/00 257/E21.521 |
| 5,182,632 A | * | 1/1993 | Bechtel | ............... H01L 23/3675 257/713 |

(Continued)

FOREIGN PATENT DOCUMENTS

| DE | 10214311 A1 | 10/2003 |
| EP | 0112760 A1 | 7/1984 |
| EP | 0218022 A2 | 4/1987 |

OTHER PUBLICATIONS

PCT Search Report for application PCT/US2015/016391 dated Jun. 12, 2015, 118 pages.

*Primary Examiner* — Anthony Haughton
*Assistant Examiner* — Yahya Ahmad (57) ABSTRACT

A surface mount device is disclosed. The surface mount device can include an electronic component operable in an electronic circuit. The surface mount device can also include a heat transfer component thermally coupled to the electronic component. The heat transfer component can have a heat transfer surface configured to interface with a heat sink. In addition, the surface mount device can include a resiliently flexible lead to electrically couple the electronic component to a circuit board. The resiliently flexible lead can be configured to resiliently deflect to facilitate a variable distance of the heat transfer surface from the circuit board, to enable the heat transfer surface and a planar heat transfer surface of another similarly configured surface mount device to be substantially aligned for interfacing with the heat sink.

21 Claims, 6 Drawing Sheets

(51) Int. Cl.
*H05K 3/30* (2006.01)
*H05K 3/32* (2006.01)

(52) U.S. Cl.
CPC ....... *H05K 3/305* (2013.01); *H05K 2201/1056* (2013.01); *H05K 2201/10628* (2013.01); *H05K 2201/10689* (2013.01); *Y02P 70/613* (2015.11)

(58) Field of Classification Search
USPC .................. 361/679.46–679.54, 688–723
See application file for complete search history.

(56) References Cited

U.S. PATENT DOCUMENTS

| | | | | |
|---|---|---|---|---|
| 5,317,479 | A | * 5/1994 | Pai | H01L 23/49861 174/260 |
| 5,455,462 | A | * 10/1995 | Marrs | H01L 21/4878 257/712 |
| 5,615,087 | A | 3/1997 | Wieloch | |
| 5,666,721 | A | 9/1997 | Sakemi | |
| 5,969,940 | A | 10/1999 | Sano et al. | |
| 6,377,464 | B1 | * 4/2002 | Hashemi | H01L 23/552 257/516 |
| 2008/0224309 | A1 | * 9/2008 | Hori | H01L 24/81 257/737 |
| 2009/0213552 | A1 | * 8/2009 | Mauder | G02B 6/4494 361/709 |

* cited by examiner

METHOD TO ALIGN SURFACE MOUNT PACKAGES FOR THERMAL ENHANCEMENT

BACKGROUND

Surface mount technology (SMT) is commonly used to produce electronic circuits, in which components or "packages" are mounted or placed directly onto the surface of printed circuit boards (PCBs) or printed wiring boards (PWBs). Typically, in situations where multiple packages are to interface with a heat sink, leads extending from the packages are soldered to a circuit board and the packages are supported above the circuit board for underfill by an adhesive, which secures the packages to the circuit board. Because this process can result in uneven package heights from the circuit board, heat transfer surfaces of the packages can be unaligned in a common plane for interfacing with a heat sink. To remedy this dimensionally variable thermally resistive space, a gap filler material can be applied to the packages to build up sacrificial material that can be ground and/or lapped to form heat transfer surfaces that are aligned in a common plane.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

Although the techniques for securing typical surface mount technology (SMT) packages to circuit boards and aligning heat transfer surfaces of such packages in a common plane for interfacing with a heat sink have been serviceable, there are drawbacks. For example, applying and grinding/lapping sacrificial material to form aligned heat transfer surfaces is time consuming and expensive. In addition, once a package has been underfilled by adhesive, it may be too expensive to repair an individual faulty package due to the time and expense involved in applying and lapping sacrificial material to form aligned heat transfer surfaces. As a result, an entire circuit board having an array of packages may be scrapped due to a single faulty package, which can limit the size of package arrays that are designed and manufactured in order to mitigate the risk of loss. SMT assembly costs can therefore be improved by devices and methods that facilitate inexpensive assembly, alignment of heat transfer surfaces, and replacement of faulty packages or components.

Accordingly, a surface mount device is disclosed that facilitates fast and inexpensive assembly and alignment of heat transfer surfaces across multiple surface mount devices. In one aspect, a faulty surface mount device can be quickly and easily replaced, such that a heat transfer surface of the surface mount device is aligned with a heat transfer surface of another surface mount device. This replacement can usually be performed using the same methods and tools as the original placement process. The surface mount device can include an electronic component operable in an electronic circuit. The surface mount device can also include a heat transfer component thermally coupled to the electronic component. The heat transfer component can have a planar heat transfer surface configured to interface with a heat sink. In addition, the surface mount device can include a resiliently flexible lead to electrically couple the electronic component to a circuit board. The resiliently flexible lead can be configured to resiliently deflect to facilitate a variable distance between the heat transfer surface and the circuit board, to enable the heat transfer surface and a heat transfer surface of another surface mount device to be substantially aligned in a common plane for interfacing with the heat sink.

In one aspect, a surface mount system is disclosed. In one example, the system can include a circuit board and a plurality of surface mount devices. Each surface mount device can have an electronic component operable in an electronic circuit, a heat transfer component thermally coupled to the electronic component and configured to interface with a heat sink, and a resiliently flexible lead to electrically couple the electronic component to the circuit board. In this example, and not intending to be limiting, the heat transfer component can comprise a planar heat transfer surface. Other surface configurations are contemplated, as needed or desired, such as non-planar, or a non-planar and planar combination. The resiliently flexible leads can be configured to resiliently deflect to facilitate variable distances between the planar heat transfer surfaces and the circuit board, to enable the planar heat transfer surfaces to be substantially aligned in a common plane for interfacing with the heat sink.

Figure 1:
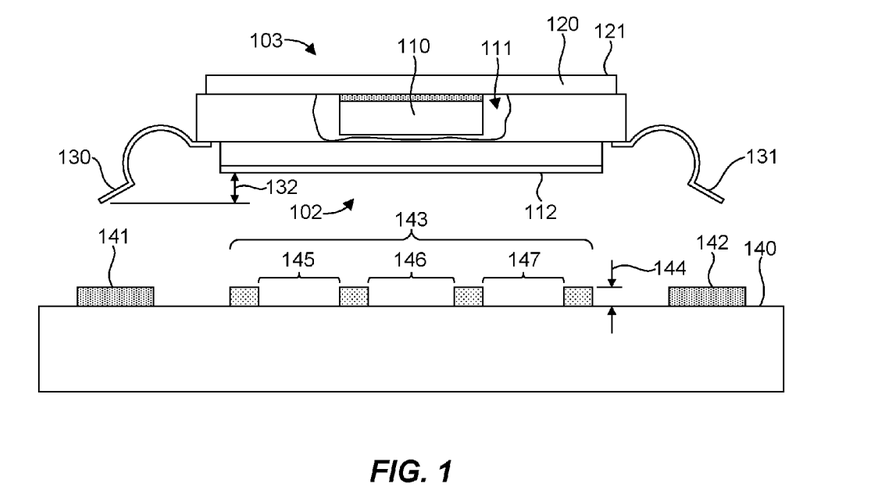
FIG. 1 is an illustration of a surface mount device in accordance with an example of the present disclosure.

One example of a surface mount device 100 is illustrated in FIG. 1. The surface mount device 100 can include an electronic component 110 operable in an electronic circuit, such as a radio frequency (RF) circuit. For instance, the electronic component 110 can comprise a gallium nitride (GaN) high power solid state amplifier that can be incorporated into an electronically scanned array, such as for RADAR and secure communication applications. In one aspect, the electronic component 110 can be disposed in a cavity 111, which can be formed in part by a lid 112 that covers the electronic component 110. The surface mount device 100 can also include a heat transfer component 120 thermally coupled to the electronic component 110. In this example, the heat transfer component 120 comprises a planar heat transfer surface 121 configured to interface with a heat sink, which may be of any suitable configuration or type. In general, the surface mount device 100 can be of any suitable form or configuration. In some cases, the surface mount device 100 can be configured as a package typical of those used in electronic devices, which may conform to a standardized package configuration.

Figure 2A:
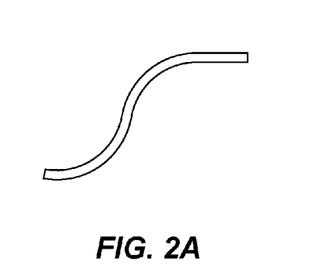
FIGS. 2A-2C are illustrations of resiliently flexible leads of a surface mount device in accordance with several of the examples of the present disclosure.
Figure 2B:
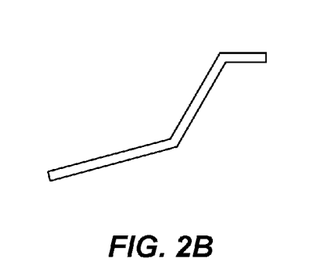
Figure 2C:
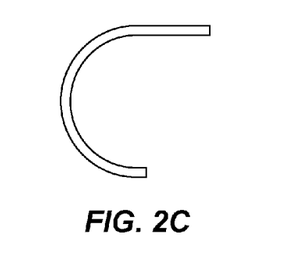

In addition, the surface mount component 100 can include a resiliently flexible lead, such as the flexible leads 130, 131 shown in the example surface mount component 100, to electrically couple the electronic component 110 to a circuit board 140. The circuit board 140 can be of any suitable type, such as a printed wiring board. As described in more detail hereinafter, the resiliently flexible leads 130, 131 can be configured to resiliently deflect to facilitate a variable distance between the planar heat transfer surface 121 and the circuit board 140, to enable or facilitate the planar heat transfer surface 121 and a planar heat transfer surface (now shown) of another surface mount device to be substantially aligned in a common plane for interfacing with a heat sink. The resiliently flexible leads 130, 131 can be of any suitable configuration that facilitate spring-like resiliency and electrical coupling with coupling members on the circuit board 140. For example, flexible lead configurations can include a "U" configuration (FIG. 1), a gullwing configuration having rounded corners (FIG. 2A), a gullwing configuration having angled corners (FIG. 2B), a "J" configuration (FIG. 2C), and others. Indeed, these are not meant to be limiting in any way, as alternate electrical interconnect approaches to the resiliently flexible lead could include, but are not limited to, wire bonding, ribbon bonding, leadless chip carrier (LCC), or ball grid array (BGA) SMT technology to achieve electrical connection and maintain planar alignment of the surfaces.

The coupling members on the circuit board 140 can be designed to receive or secure and electrically couple the flexible leads 130, 131. In one example, the coupling members can comprise solder 141, 142 disposed on the circuit board 140, such as in the form of solder paste, to electrically couple the resiliently flexible leads 130, 131 to the circuit board 140. An adhesive 143, such as epoxy, can also be disposed (e.g., dispensed or otherwise applied or deposited) on the circuit board 140, such as in proximity to the solder 141, 142, to structurally support the surface mount device 100 about the circuit board 140. In one aspect, the adhesive 143 can be part of a load path, such as a compressive load from the heat sink 120 to the circuit board 140, and can therefore be configured to provide the necessary structural support. In another aspect, the adhesive 143 can be conductive for electrical performance of the surface mount component 100. The adhesive 143 can be disposed on the circuit board 140 having a height 144 with voids 145-147 or recesses or gaps to facilitate displacement of the adhesive 143 into the voids 145-147 or recesses as the surface mount component 100 is pressed into the adhesive 143, thus resulting in an adhesive thickness less than the original height 144 of the adhesive. In other words, as the distance of the planar heat transfer surface 121 from the circuit board 140 decreases, or as the planar heat transfer surfaces are brought into alignment, the adhesive 143 can spread or displace into the voids 145-147 or recesses, which can facilitate adhesive or bond thickness or height variations from one surface mount device to another. Thus, the adhesive 143 can be configured to be adaptable to various thicknesses and function properly at various thicknesses. In some cases, the voids 145-147 or recesses can be partially or completely eliminated once the surface mount component 100 has been pressed into the adhesive 143. In one aspect, the entire adhesive area can be covered in adhesive having varying heights to form voids or recesses.

Figure 3A:
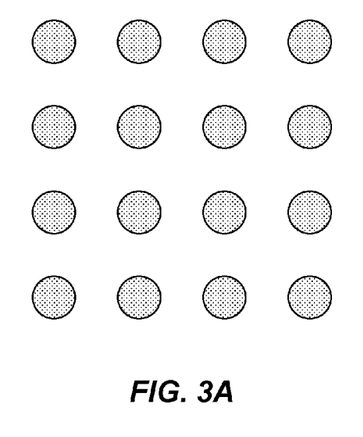
FIGS. 3A-3D are illustrations of adhesive configurations for a surface mount device in accordance with several of the examples of the present disclosure.
Figure 3B:
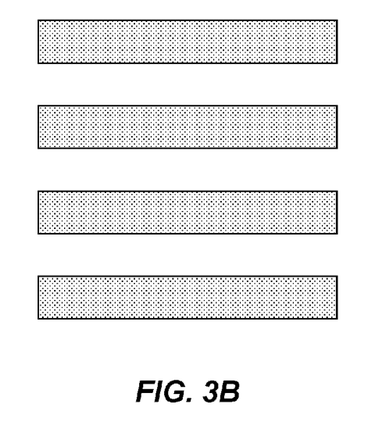
Figure 3C:
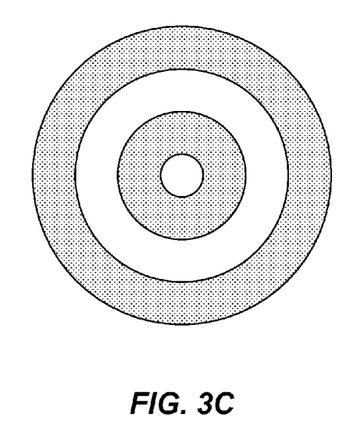
Figure 3D:
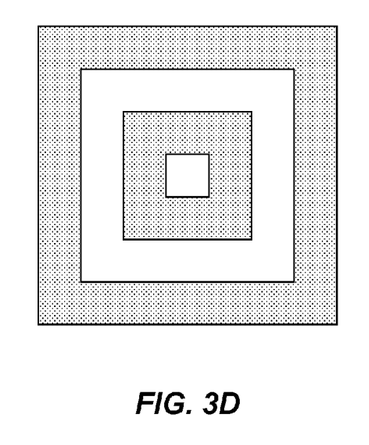

The adhesive 143 can be disposed on the circuit board 140 in any suitable configuration or pattern, such as an array configuration of dots or columns (FIG. 3A), a row configuration (FIG. 3B), a concentric circular ring configuration (FIG. 3C), and/or a concentric square ring configuration (FIG. 3D). It should be recognized that a surface mount device can include voids or recesses, such as in a lid, configured to interface with and receive the adhesive. In this case the surface mount device can provide a place for displaced adhesive to flow or spread as the surface mount device is pressed into the adhesive, regardless of the adhesive configuration, which may be a layer of uniform thickness.

In one aspect, the resiliently flexible lead 130, 131 can be configured to extend below the bottom side 102 of the surface mount device 100 a distance 132 to ensure contact by the resiliently flexible lead 130, 131 with the circuit board 140 and/or the solder 141, 142 before the bottom side 102 of the surface mount device 100 contacts the circuit board 140 and/or the adhesive 143. The distance 132 that the resiliently flexible lead 130, 131 extends below the bottom side 102 can be configured to provide a range of vertical travel sufficient for the planar heat transfer surface 121 of the surface mount device 100 to be aligned with the planar heat transfer surfaces of other surface mount devices, these being similarly configured and able to be aligned one with another. In another aspect, the resiliently flexible leads 130, 131 can be configured to provide spring-like vertical compliance, while not being detrimental to lateral alignment as the resiliently flexible leads 130, 131 are being vertically compressed. The resiliently flexible leads 130, 131 can be constructed of any suitable resiliently flexible and conductive material, such as beryllium copper.

As shown in FIG. 1, the lid 112 can be on a side of the surface mount device 100 opposite the heat transfer component 120. In this case, the lid 112 is disposed on a bottom side 102 of the surface mount device 100 and the heat transfer component 120 is disposed on a top side 103 of the surface mount device 100. In one aspect, the resiliently flexible leads 130, 131 can extend in the opposite direction of typical leads, such that the surface mount device 100 is "upside down." In addition, the electronic component 110 can be thermally coupled to the heat transfer component 120, which has the planar heat transfer surface 121 configured to interface with a heat sink. In this configuration, the "signal" from the electronic component 110 can be configured to go downward toward the circuit board 140 and heat can be configured to go upward toward a heat sink. The signal and heat can therefore be separate and configured to travel in opposite directions. Such a configuration can provide an effective thermal path from the electronic component 110 to the planar heat transfer surface 121, which interfaces with a system level heat sink (not shown in figure).

Figure 4A:
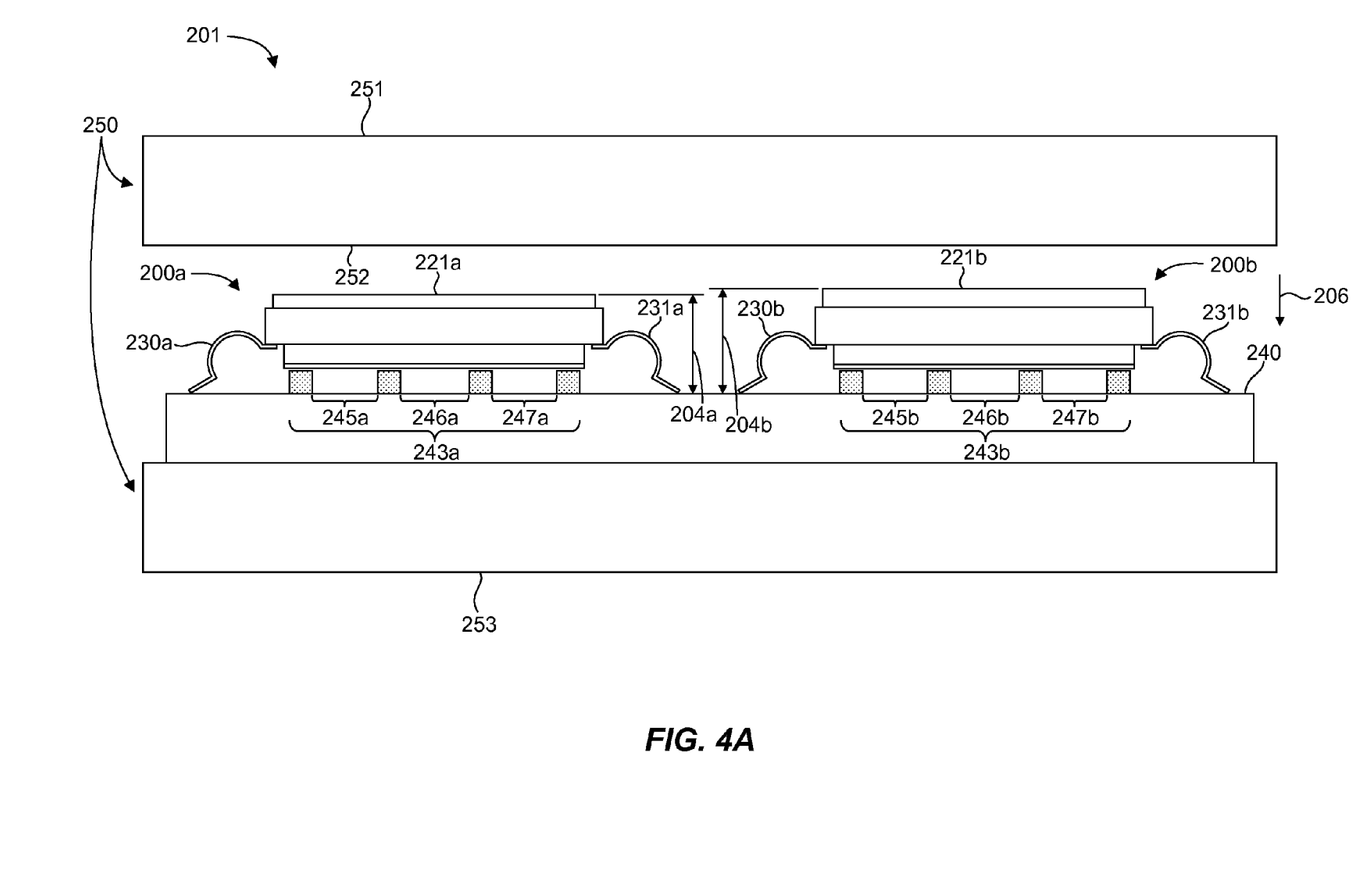
FIG. 4A is an example illustration of a surface mount system prior to planarization, in accordance with an example of the present disclosure.
Figure 4B:
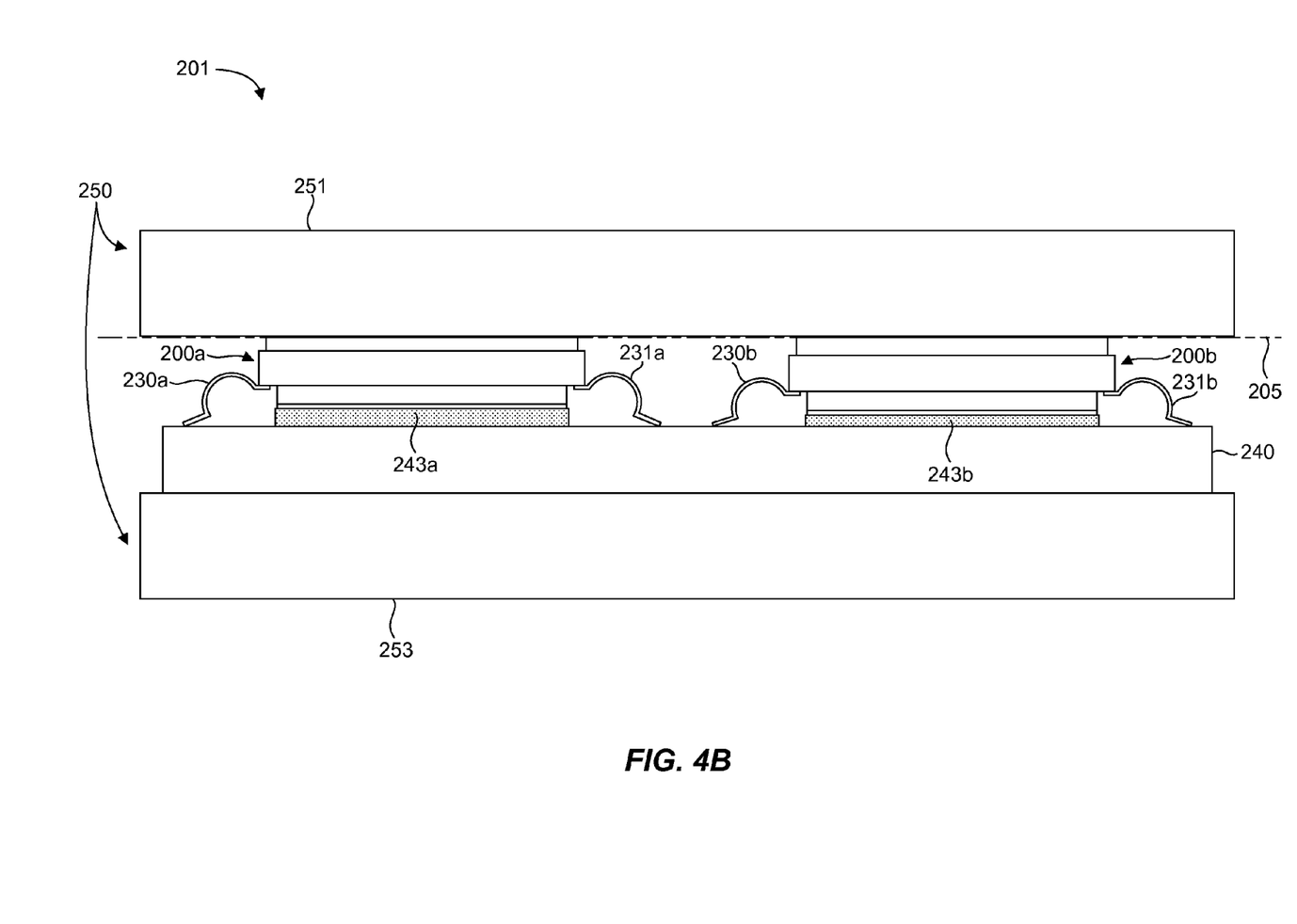
FIG. 4B is an example illustration of the surface mount system of FIG. 4A upon planarization, in accordance with an example of the present disclosure.
Figure 4C:
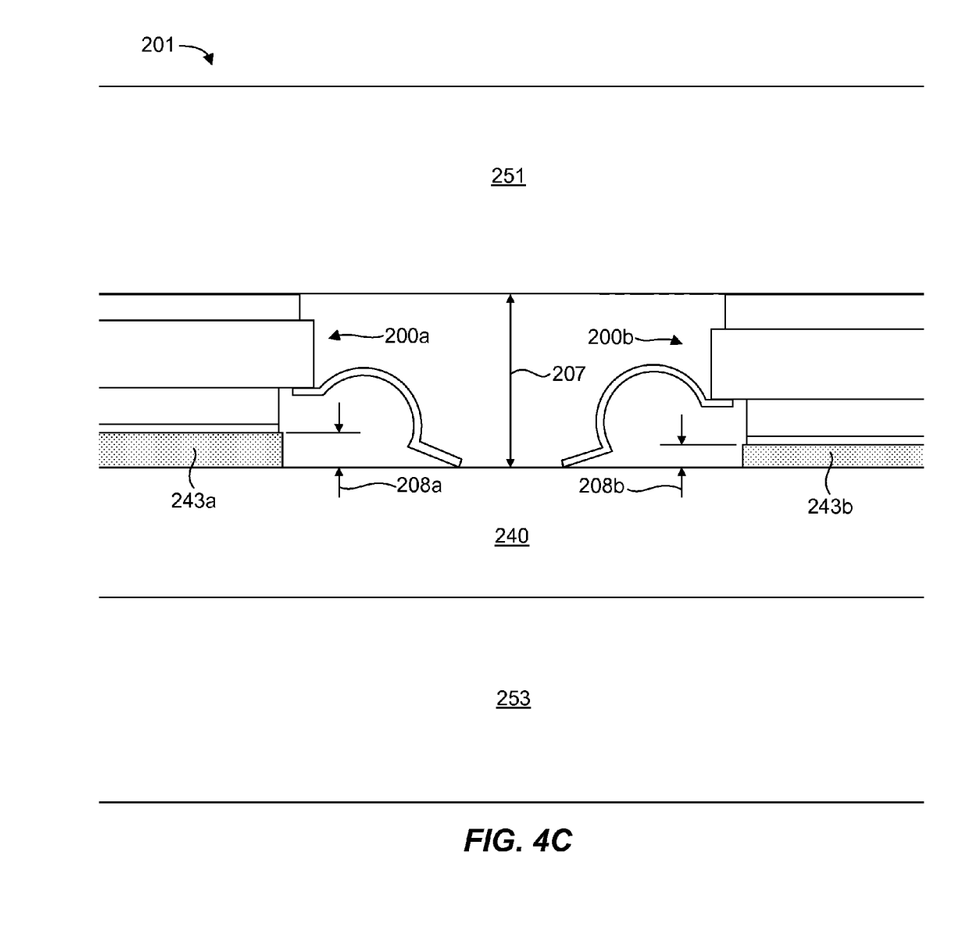
FIG. 4C is a detail view of the surface mount system of FIG. 4B.

FIGS. 4A-4C illustrate a surface mount system 201, in accordance with an example of the present disclosure. The surface mount system 201 can include a circuit board 240 and surface mount devices 200a, 200b, which are similar to the surface mount device 100 described hereinabove. Due to manufacturing or size variations of the surface mount devices 200a, 200b and/or the circuit board 240, heat transfer surfaces 221a, 221b (which in this example are planar surfaces) of the surface mount devices 200a, 200b shown in FIG. 4A, respectively, have different vertical heights 204a, 204b above the circuit board 240 when resting on resiliently flexible leads 230a, 231a and 230b, 231b prior to being secured to the circuit board 240 with solder (omitted for clarity) and adhesive 243a, 243b, respectively.

In one aspect, the surface mount system 201 can include a planarization tool 250 to facilitate substantial alignment or "planarization" of the planar heat transfer surfaces 221a, 221b in a common plane 205 (FIG. 4B). The planarization tool 250 can include an alignment member 251 having a planar alignment surface 252 configured to interface with the planar heat transfer surfaces 221a, 221b. The alignment member 251 can move relative to the circuit board 240 in direction 206 (FIG. 4A) to facilitate alignment of the planar heat transfer surfaces 221a, 221b in the common plane 205 (FIG. 4B). In one aspect, the planarization tool 250 can also include a backing member 253 configured to support the circuit board 240. The alignment member 251 and the backing member 253 can be movable relative to one another in direction 206 to facilitate alignment of the planar heat transfer surfaces 221a, 221b. As discussed above, the resiliently flexible leads 230a, 231a and 230b, 231b can be configured to resiliently deflect as the surface mount devices 200a, 200b are caused to move in direction 206 by the alignment member 251 to facilitate variable distances between the planar heat transfer surfaces 221a, 221b and the circuit board 240, which can enable the planar heat transfer surfaces 221a, 221b to be substantially aligned in the common plane 205 for interfacing with a heat sink.

When the planar heat transfer surfaces 221a, 221b are aligned co-planar to one another, solder and adhesive (or other securing solutions) can secure the surface mount devices 200a, 200b in place (preventing movement in X, Y, and Z directions) on the circuit board 240. In one aspect, heat can be applied in order to reflow solder and soften the adhesive 243a, 243b to accommodate vertical movement of the surface mount devices 200a, 200b into the adhesive 243a, 243b, as facilitated by the compliance of the resiliently flexible leads 230a, 231a and 230b, 231b. For example, as shown in FIG. 4A, voids 245a-247a, 245b-247b exist in the adhesives 243a, 243b, respectively. Until cured, the adhesives 243a, 243b can move and flow into the voids 245a-247a, 245b-247b, as shown in FIG. 4B, in response to vertical movement of the surface mount devices 200a, 200b in direction 206 as acted on and compressed by the alignment member 251. Once the planar heat transfer surfaces 221a, 221b have been aligned by the alignment member 251, as facilitated by the deflection of the resiliently flexible leads 230a, 231a and 230b, 231b and/or the displacement of adhesive 243a, 243b, the planar heat transfer surfaces 221a, 221b are at substantially the same distance 207 from the circuit board 240, as shown in FIG. 4C. In addition, there are different adhesive thicknesses 208a, 208b between the surface mount devices 200a, 200b and the circuit board 240, respectively. The resiliently flexible leads 230a, 231a and 230b, 231b and/or the adhesives 243a, 243b can therefore accommodate manufacturing or size differences (i.e., tolerance stack-up) in the surface mount devices 200a, 200b to facilitate alignment of the planar heat transfer surfaces 221a, 221b for interfacing with a heat sink.

The alignment member 251 can remain in a fixed position relative to the circuit board 240 until the adhesives 243a, 243b and solder have solidified, at which time the alignment member 251 can be removed, and at which time the aligned planar heat transfer surfaces 221a, 221b are ready to be assembled with a heat sink. Although a heat sink is not shown, it is contemplated that a heat sink interface with the planar heat transfer surfaces 221a, 221b similar to the interface with the alignment member 251 shown in FIG. 4B.

In one aspect, the surface mount devices 200a, 200b can be disposed in the adhesive 243a, 243b, respectively, using "pick and place" manufacturing tools and methods. For example, a "pick and place" tool can be relied on to accurately align the planar heat transfer surfaces 221a, 221b with one another when embedding the surface mount devices 200a, 200b in the adhesive 243a, 243b. A snap cure adhesive or epoxy can be used to secure each surface mount device 200a, 200b once placed on the circuit board 240.

Figure 5:
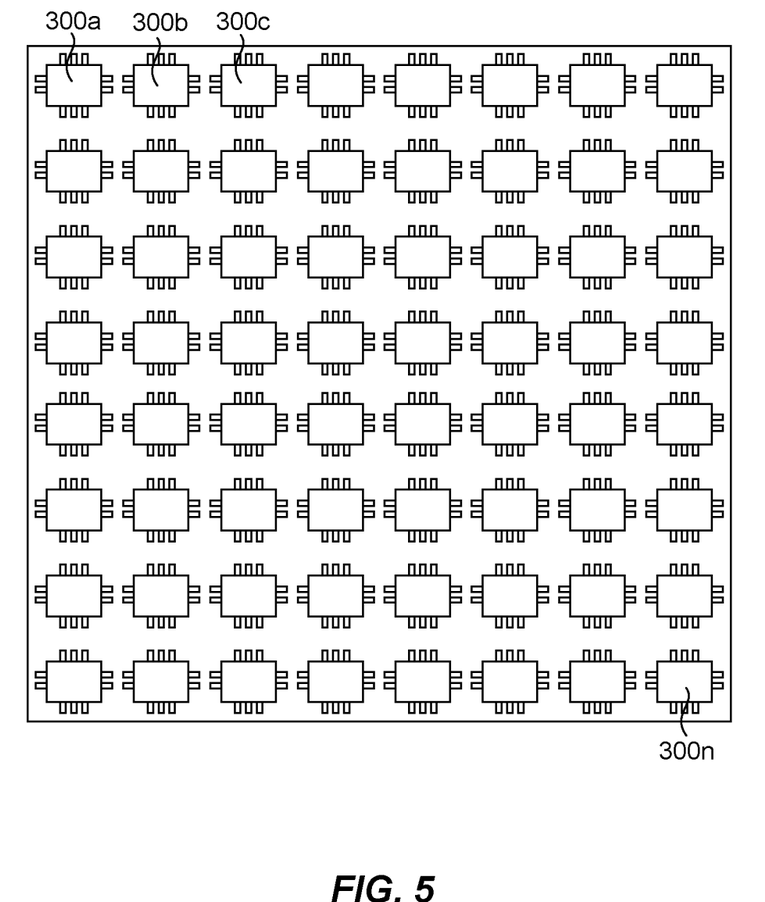
FIG. 5 is an example illustration of an array of surface mount devices in accordance with an example of the present disclosure.

Using the devices, tools, and methods disclosed herein, any suitable number of surface mount devices 300a-n can be arranged together, as illustrated in FIG. 5, such that respective planar heat transfer surfaces are substantially aligned in a common plane for interfacing with a heat sink. As shown in the figure, the surface mount devices 300a-c and 300n (representative of multiple surface mount devices a-n) can be configured as an array, such as an N×M array. Such an array can be an RF or electronically scanned array, which can be used as part of an electronics assembly, such as an antenna. In one aspect, any of the surface mount devices 300a-n can be easily repaired, without the need for costly rework or scrapping of the entire array or electronics assembly. For example, an individual faulty surface mount device can simply be removed from the array by heating to soften the solder and adhesive and replaced by a new surface mount device. The planar heat transfer surface of the new surface mount device can be aligned with the other planar heat transfer surfaces of the array using the tools and techniques described hereinabove. The ease of repair can enable the design and manufacture of large arrays without the risk of costly rework or scrapping of the entire array due to a single faulty component. The devices, tools, and methods disclosed herein can therefore minimize scrap and costs associated with the design and manufacture of such arrays.

In accordance with one embodiment of the present invention, a method for manufacturing a surface mount assembly is disclosed. The method can comprise obtaining a circuit board. The method can also comprise obtaining a plurality of surface mount devices, each surface mount device having an electronic component operable in an electronic circuit, a heat transfer component thermally coupled to the electronic component and having a heat transfer surface (e.g., a planar heat transfer surface) configured to interface with a heat sink, and a resiliently flexible lead to electrically couple the electronic component to the circuit board. The method can further comprise disposing the plurality of surface mount devices on the circuit board. Additionally, the method can comprise aligning the heat transfer surfaces in a common plane for interfacing with the heat sink, wherein the resiliently flexible leads resiliently deflect a sufficient distance to facilitate alignment, for example, in a common plane, between the heat transfer surfaces of the plurality of surface mount devices. Aligning the heat transfer surfaces can result in variable distances of the various heat transfer surfaces and the circuit board. It is noted that no specific order is required in this method, though generally in one embodiment, these method steps can be carried out sequentially.

In one aspect of the method, aligning the heat transfer surfaces can comprise contacting the heat transfer surfaces with an alignment surface (e.g., a planar alignment surface) of an alignment member. In a particular aspect, the method can further comprise supporting the circuit board with a backing member, and moving the alignment member and the backing member relative to one another to align the heat transfer surfaces. In another aspect, the method can further comprise disposing adhesive on the circuit board to structurally support the surface mount devices about the circuit board, wherein the adhesive is disposed on the circuit board with voids to facilitate displacement of the adhesive into the voids as the distances of the heat transfer surfaces from the circuit board decrease, or as the heat transfer surfaces are brought into alignment. In a particular aspect, the method can further comprise heating the adhesive to facilitate flow of the adhesive into the voids. In another particular aspect, the method can further comprise curing the adhesive. In yet another aspect, the method can further comprise soldering the resiliently flexible leads to the circuit board.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the foregoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A surface mount device, comprising:
an electronic component operable in an electronic circuit;
a heat transfer component thermally coupled to the electronic component and having a heat transfer surface configured to interface with a heat sink; and
a resiliently flexible lead operable to electrically couple the electronic component to a circuit board,
wherein the resiliently flexible lead is configured to resiliently deflect to facilitate a variable distance of the heat transfer surface from the circuit board.

2. The surface mount device of claim 1, wherein the resiliently flexible lead facilitates alignment, in a common plane, of the planar heat transfer surface with a planar heat transfer surface of another surface mount device electrically coupled to the circuit board.

3. The surface mount device of claim 1, wherein the electronic component is operable in a radio frequency (RF) circuit.

4. The surface mount device of claim 3, wherein the electronic component comprises an amplifier.

5. The surface mount device of claim 1, wherein the resiliently flexible lead comprises a gullwing configuration, U configuration, J configuration, or combinations thereof.

6. The surface mount device of claim 1, further comprising a lid to cover the electronic component, wherein the lid is disposed on a bottom side of the surface mount device, opposite the heat transfer component.

7. The surface mount device of claim 1, wherein the heat transfer surface is planar.

8. A surface mount system, comprising:
a circuit board; and
a plurality of surface mount devices, each surface mount device having an electronic component operable in an electronic circuit,
a heat transfer component thermally coupled to the electronic component and having a heat transfer surface configured to interface with a heat sink, and
a resiliently flexible lead electrically coupled to the electronic component and to the circuit board,
wherein the resiliently flexible leads are individually deflected a distance sufficient to cause the heat transfer surfaces of the plurality of surface mounts to be substantially aligned for interfacing with the heat sink.

9. The system of claim 8, further comprising a coupling member disposed on the circuit board electrically coupling the resiliently flexible leads to the circuit board.

10. The system of claim 9, wherein the coupling member comprises solder.

11. The system of claim 8, further comprising adhesive disposed on the circuit board to structurally support the surface mount devices about the circuit board.

12. The system of claim 11, wherein the adhesive is initially disposed on the circuit board with voids to facilitate displacement of the adhesive into the voids as the heat transfer surfaces are brought into alignment.

13. The system of claim 11, wherein the adhesive is initially disposed on the circuit board in an array configuration, a row configuration, a concentric ring configuration, or combinations thereof.

14. The system of claim 8, further comprising a planarization tool to facilitate substantial alignment of the heat transfer surfaces in the common plane.

15. The system of claim 14, wherein the planarization tool comprises an alignment member having a planar alignment surface configured to interface with the planar heat transfer surfaces.

16. The system of claim 15, wherein the planarization tool further comprises a backing member configured to support the circuit board, and wherein the alignment member and the backing member are movable relative to one another to facilitate alignment of the planar heat transfer surfaces.

17. A method for manufacturing a surface mount assembly, comprising:
obtaining a circuit board;
obtaining a plurality of surface mount devices, each surface mount device having an electronic component operable in an electronic circuit,
a heat transfer component thermally coupled to the electronic component and having a heat transfer surface configured to interface with a heat sink, and
a resiliently flexible lead operable to electrically couple the electronic component to the circuit board;
disposing the plurality of surface mount devices on the circuit board;
aligning the heat transfer surfaces in a common plane for interfacing with the heat sink, wherein the resiliently flexible leads resiliently deflect a sufficient distance to facilitate alignment between the heat transfer surfaces of the plurality of surface mount devices.

18. The method of claim 17, further comprising supporting the circuit board with a backing member, and moving the alignment member and the backing member relative to one another to align the heat transfer surfaces.

19. The method of claim 17, further comprising disposing adhesive on the circuit board to structurally support the surface mount devices about the circuit board, wherein the adhesive is disposed on the circuit board with voids to facilitate displacement of the adhesive into the voids as the distances of the heat transfer surfaces from the circuit board decrease.

20. The method of claim 19, further comprising heating the adhesive to facilitate flow of the adhesive into the voids.

21. The method of claim 19, further comprising curing the adhesive.

* * * * *